United States Patent [19]

Van Degrift et al.

[11] 4,087,738

[45] May 2, 1978

[54] MAGNETIC RESONANCE DETECTION METHOD AND APPARATUS

[75] Inventors: Craig T. Van Degrift, Potomac, Md.; Donald B. Utton, Southampton, England

[73] Assignee: The United States of America as represented by the Secretary of Commerce, Washington, D.C.

[21] Appl. No.: 774,094

[22] Filed: Mar. 3, 1977

[51] Int. Cl.$^2$ ............................................. G01R 33/08
[52] U.S. Cl. .................................. 324/.5 A; 324/.5 R; 324/61 QS
[58] Field of Search ............... 324/61 QS, 34 D, .5 R, 324/.5 A, .5 AC, .5 AH, 60 R, 61 R

[56] References Cited

U.S. PATENT DOCUMENTS

| | | | |
|---|---|---|---|
| 2,772,393 | 11/1956 | Davis | 324/61 QS |
| 3,023,358 | 2/1962 | Kirchner | 324/.5 R |
| 3,112,441 | 11/1963 | Robinson | 324/.5 A |
| 3,684,952 | 8/1972 | Lundstrom | 324/61 QS |

*Primary Examiner*—Rudolph V. Rolinec
*Assistant Examiner*—Michael J. Tokar
*Attorney, Agent, or Firm*—Eugene J. Pawlikowski; Alvin J. Englert

[57] ABSTRACT

A method and apparatus for detecting magnetic resonance of a sample. The apparatus utilizes an exceptionally stable tunnel diode rf oscillator incorporating a LC reentrant cavity resonator. The method entails measuring a magnetic resonance of the sample through the frequency of the oscillator. The resulting dispersion curve can be utilized to obtain the static magnetic susceptibility of the sample. From the value of the static magnetic susceptibility additional parameters may be determined such as material density, temperature or particle spin. The method and apparatus has applications in NMR, NQR and ESR measurements.

22 Claims, 4 Drawing Figures

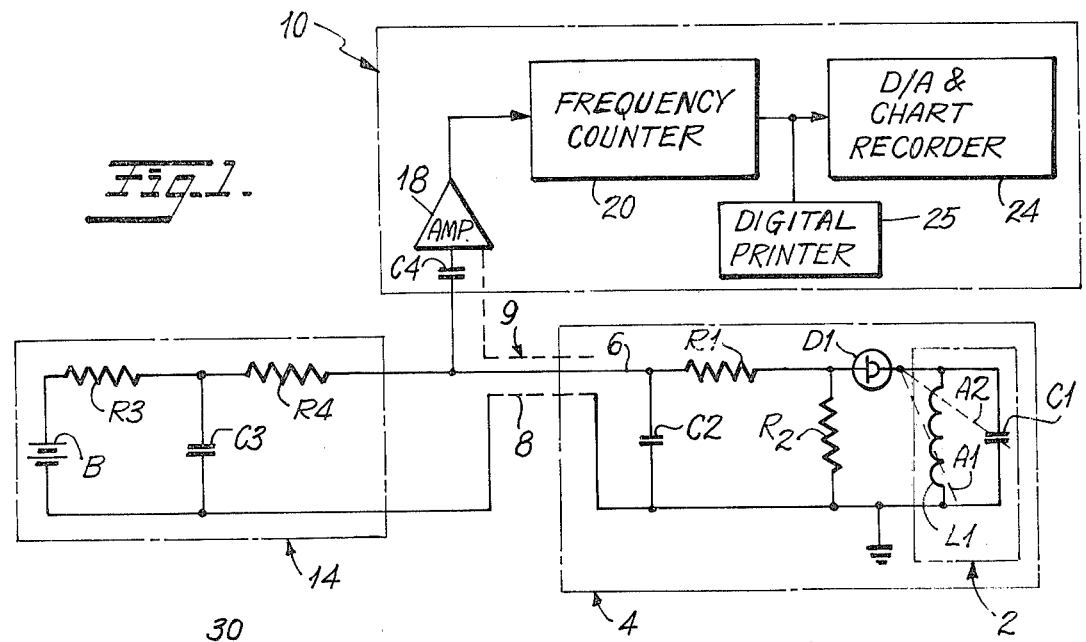
Fig. 1.
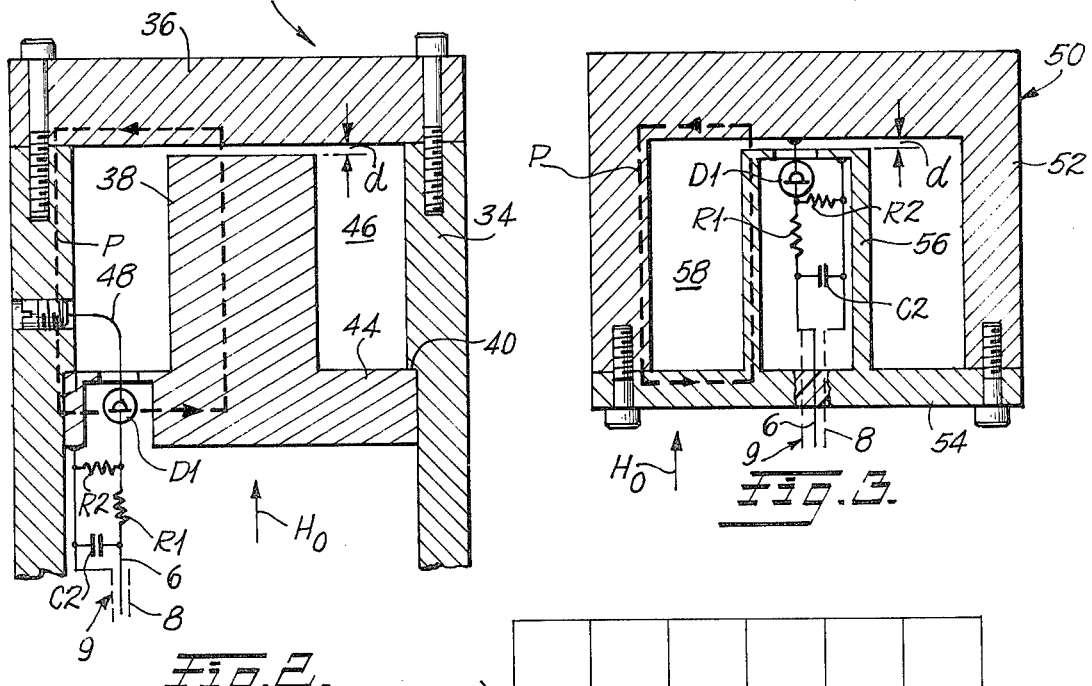
Fig. 2.
Fig. 3.
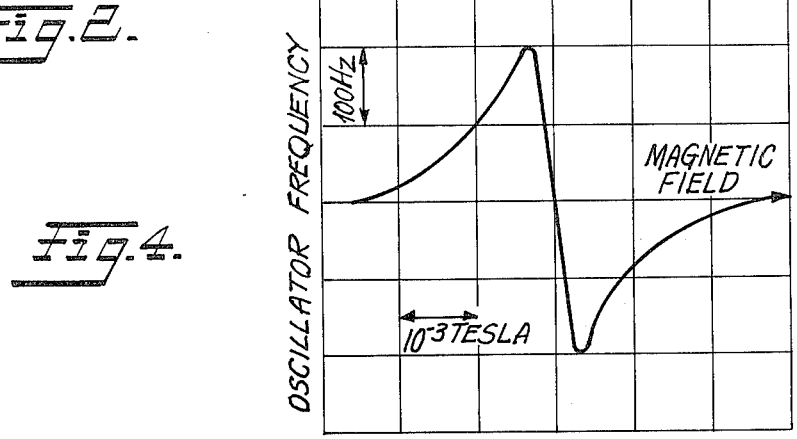
Fig. 4.

MAGNETIC RESONANCE DETECTION METHOD AND APPARATUS

BACKGROUND OF THE INVENTION

1. Field of the Invention

The invention is in the field of magnetic resonance measurements particularly as related to the determination of magnetic susceptibilities.

2. Description of the Prior Art

Magnetic resonance has long been a useful technique for measuring a variety of parameters associated with bulk materials such as, for example, spin/lattice relaxation times, spin/spin relaxation times, self-diffusion coefficients, sample densities, nuclear magnetic moments, nuclear quadrupole moments, spins, and magnetic susceptibilities. Fundamental to the nuclear magnetic resonance phenomenon are the energy level transitions of nuclei resulting from induced emission or absorption by the sample nuclei placed in a rf field. Magnetic resonance has been theoretically described both in classical and quantum mechanical terms and many experimental techniques have been devised which by and large confirm theoretical predictions. Detailed considerations of theoretical and experimental approaches to magnetic resonance may be found in the literature, as for example, *The Principles of Nuclear Magnetism* by A. Abragam and *Nuclear Magnetic Resonance* by E. R. Andrew.

Nuclear magnetic resonance techniques have long been utilized for the determination of various parameters such as nuclear magnetic susceptibilities. Typical of these measurements are rf bridge techniques wherein sample nuclei within a multiturn coil in a LC circuit are placed in parallel with a dummy tuned circuit. The sample nuclei resonance unbalances the bridge to produce an output signal whose amplitude is measured and recorded. Typically, the absorption or dispersion curve may be determined. Other techniques utilize a marginal oscillator approach wherein a sample coil and condenser form a parallel tuned circuit within a rf oscillator. The absorption spectrum may then be determined by sweeping the magnetic field through resonance and measuring the voltage amplitude of the oscillator. Optionally, the magnetic field may be fixed and the oscillator frequency varied to achieve a resonance. In both the bridge and maginal oscillator techniques the output signal is a voltage level, and the variation of the voltage level is measured to detect the resonance. Although such experiments are useful for the determination of relative nuclear susceptibilities, they inherently lack a means for accurately calibrating the system so that accurate or "absolute" nuclear susceptibilities may be determined. It is not possible to calibrate these susceptibility measurements accurately since the exact amount of energy absorbed in the sample depends on various circuit parameters which are not well-defined including, for example, the non-linearity of the oscillator and the gain of the amplifier and/or detector utilized. Amplifier gain, or more generally the gain of the measuring electronics as a whole, often shifts in time preventing any accurate determination of magnetic susceptibilities. Additionally, the multi-turn coils utilized to surround the sample nuclei impose problems in the determination of filling factors and demagnetization factors which further add to the errors in any "absolute" measurement.

Experiments have been conducted measuring the frequency jump in the NMR oscillator as a means for determining the nuclear polarization as, for example, described by Timsit et al. in "Nuclear Polarization Measurements of Oriented $^3$He Gas by 'Frequency Jump' Spectrometry," *Review of Scientific Instruments*, Vol. 47, No. 8, August 1976. However, in relating these frequency jumps to the nuclear polarization, standard pulsed NMR techniques are employed involving an amplitude measurement originating from signals induced in a pickup coil. Thus, the calibration of the frequency jump ultimately rests upon an amplitude measurement which is itself susceptible to the same disadvantages present in the bridge and marginal oscillator techniques discussed heretofore.

SUMMARY OF THE INVENTION

It is an object of the invention to provide a novel method and apparatus for detecting magnetic resonance by measuring the output frequency of a free-running oscillator incorporating a reentrant cavity resonator.

A further object of the invention is to overcome the disadvantages of the prior art by providing a method and apparatus for accurately measuring the static nuclear susceptibility of sample nuclei in a manner free from the indeterminable factors affecting conventional methods.

Another object of the invention is to provide a method and apparatus for measuring the frequency of an LC resonance circuit in order to provide an accurate determination of magnetic resonance parameters.

Yet another object of the invention is to provide apparatus of a particular simple geometry which allows accurate determination of the filling factor parameter in nuclear resonance experiments. The apparatus employed comprises a reentrant cavity resonator and an extremely stable tunnel diode oscillator.

The invention provides a method of determining the static nuclear susceptibility of materials. Sample nuclei are placed in the cavity region of a capacitively loaded coaxial resonator, more simply termed a reentrant cavity resonator, having a well-defined geometry. A tunnel diode forms the negative resistance element of an extremely stable oscillator which incorporates the LC reentrant cavity resonator. The frequency shift of the tunnel diode oscillator is measured as the external magnetic field is varied. The oscillator frequency shift results from the dispersion signal of sample nuclei and allows a highly accurate and continuous determination of the dispersion curve as a function of magnetic field. By measuring frequency rather than a voltage amplitude, one eliminates uncertainties of amplifier and circuit gain to provide a highly accurate "absolute" determination of resonance parameters. The Krönig-Kramers integrals may be utilized to relate the dispersion curve to the absorption curve, and the static magnetic susceptibility is then determined by integrating the resulting absorption curve. The method and apparatus may also be utilized to determine other parameters such as particle density or temperature if the static susceptibility is known.

More generally, the apparatus of the invention permits a measurement of the frequency of an oscillating rf field during a magnetic resonance as a continuous function of the external magnetic field, thereby permitting accurate determination of resonance parameters.

BRIEF DESCRIPTION OF THE DRAWINGS

These and other objects of the invention will become apparent from the detailed description of the preferred embodiment as set forth below wherein:

FIG. 1 is a block schematic circuit diagram of the invention showing the tunnel diode oscillator circuit in combination with the reentrant cavity resonator;

FIG. 2 is a side cross-sectional view of the reentrant cavity resonator showing the oscillator circuit connected thereto;

FIG. 3 is a side cross-sectional view of another embodiment of the reentrant cavity resonator with the tunnel diode oscillator circuit connected thereto; and FIG. 4 is a plot of the oscillator frequency versus magnetic field at a nuclear resonance condition.

DETAILED DESCRIPTION OF THE PREFERRED EMBODIMENT

THEORETICAL DISCUSSION

The static magnetic susceptibility of a material is defined as the magnetization of the material divided by the applied magnetic field. The static susceptibility may be written as $$\chi_0 = \frac{N\mu^2(I+1)}{3kT_sI} \quad (1)$$

where $N$ is the volume number density of nuclei, $\mu$ is the nuclear magnetic moment, $I$ is the nuclear spin, $k$ is Boltzmann's constant, and $T_s$ is the spin temperature. The variation of the magnetic susceptibility with the inverse of the spin temperature is the well known Curie law. Equation (1) is given in terms of the cgs system of measurements. Thus, while the magnetic susceptibility is readily determinable in accordance with the method and apparatus, equation (1) may be utilized to provide a determination of other parameters of interest. Typically, the values of the magnetic moment and spin are usually well known and consequently, if $kT_s$ is accurately known, one can determine the density N of the particular nuclear species in the sample. In accordance with the principles of the invention, the density N may be determined with an accuracy better than 0.01 percent. It is quite clear that if the density is already accurately known, then equation (1) may be utilized to determine $kT_s$.

In order to determine the static (total) nuclear susceptibility of a material the sample nuclei are placed in the cavity region of a reentrant cavity resonator which forms a LC resonant circuit of a tunnel diode oscillator. A resonant cavity or, more simply, a resonator may be defined as a resonance circuit in which current is distributed in the inner surface of an enclosed chamber. A reentrant cavity resonator is a resonant cavity in which one or more sections are directed inwardly thereby confining the electric and magnetic fields to a small volume. One may alternatively define a reentrant cavity resonator as a one-turn LC circuit in which the inductor completely envelops the capacitor. The oscillator is essentially a free-running rf oscillator inasmuch as the oscillator frequency is determined by the LC resonator. The oscillator circuit utilizes a negative-resistance gain element to compensate for the positive resistance of the LC resonator, thereby providing a self-oscillating circuit. The particular embodiment of the invention employs a tunnel diode as the negative resistance element and results in an extremely stable oscillator. The characteristics of the tunnel diode oscillator have been explored in some detail and are described, for example, by Van Degrift, "Tunnel Diode Oscillator for 0.001 ppm Measurements at Low Temperatures," *Review of Scientific Instruments*, Vol. 26, No. 5, May 1975, incorporated herein by reference. The frequency of the oscillator is given to high accuracy simply by $$f = \frac{1}{2\pi\sqrt{LC}}. \quad (2)$$

The frequency of the tunnel diode/reentrant cavity resonator oscillator of the instant invention is determined by the LC reentrant cavity resonator and sample reactance, which latter is a function of the slowly varying external magnetic field $H_0$. The value of the frequency measured is highly independent of any uncertainty in electronic gain of the circuit. In fact, the frequency measurement is completely independent of amplifier gain drifts and highly independent of details of the inherently nonlinear oscillator. As a result, the frequency given by equation (2) may be quite accurately determined as a function of a magnetic field. Typically, for a sample of polytetrafluoroethylene, for example, a magnetic field of $H_0 = 1.372$ tesla may be utilized and a frequency variation of one part in $10^9$ may be measured.

Once the frequency variation has been measured as a function of varying the magnetic field through the sample resonance, one may utilize equation (2) to determine the variation of the inductance, L, as a function of external magnetic field. The inductance of the reentrant resonator may be written as $$L = L_0(1 + 4\pi\beta\chi'(H)) \quad (3)$$

where $L_0$ is the inductance of the circuit without the sample, $\beta$ is the filling factor, and $\chi'$ is the real part of the complex magnetic susceptibility given by $$\chi = \chi' - i\chi'' \quad (4)$$

$\chi'$, the real part of the complex magnetic susceptibility, is simply the dispersion curve and $\chi''$ is simply the absorption curve. Utilizing equation (3) one can readily determine $\chi'$ as a function of magnetic field from the previously determined variation of L as a function of magnetic field. Once $\chi'$ (the dispersion curve) is known, one can readily calculate $\chi''$ from the well known Kronig-Kramers integral given by $$\chi''(w) = \frac{-1}{\pi} P \int_{-\infty}^{\infty} \frac{\chi'(w')\,dw'}{w' - w} \quad (5)$$

where $w$ is the oscillator angular frequency and $P$ is the principal value of the integral. The integral of the absorption spectra $\chi''(H)$ is proportional to the static magnetic susceptibility $\chi_0$ and is given by $$\chi_0 = \frac{1}{\pi} P \int_{-\infty}^{\infty} \frac{\chi''(w')}{w'}\,dw' \quad (6)$$

In utilizing equation (3), the filling factor $\beta$ may be determined accurately from the simple geometry of the reentrant cavity resonator. The filling factor may be defined as the ratio of the square of the rf magnetic field $H_1$ (perpendicular to the slowly varying external magnetic field $H_0$) integrated over the sample volume to the total integral of the square of $H_1$ over all space. Because the conducting walls almost completely retain the $H_1$ field within the resonator, only the small skin depth penetration into the inner walls of the resonator comes into play in calculating $\beta$. As a consequence, the value of $\beta$ is only slightly less than unity and may be accurately calculated. It can be as high as $0.9990 \pm 0.0001$.

In order for the Krönig-Kramers relations to apply, it is necessary to ensure that the oscillator signal strength does not saturate the sample nuclei. Such a condition may be ensured to within 0.01% if the operating parameters are chosen such that $$H_1^2 < 1/\gamma^2 T_1 T_2 \cdot 10^4 \tag{7}$$

where
$\gamma = w_0/H_0$, the gyromagnetic ratio,
$T_1 =$ the spin/lattice relaxation time, and
$T_2 =$ the spin/spin relaxation time.

In practice, the oscillator parameters and the experimental environment may be chosen for a great variety of magnetic resonance experiments such that equation (7) is fulfilled.

It is also important to ensure that a significant fraction of the energy generated in the reentrant cavity resonator is not absorbed in the nuclear sample. If a large energy fraction is absorbed then one may expect frequency jumps to occur as described in the above-referenced Timsit et al. article. In order to ensure that the oscillator jumps do not occur, but rather that a continuous dispersion frequency plot is obtained, the value of the frequency-pulling capability of the resonant nuclei should be smaller than the width of the resonance. Consequently, one may expect a continuous dispersion curve when $$\chi_0 < \frac{1}{\pi w_0^2 T_2^2} \tag{8}$$

where the line width, for a Lorentzian resonant shape for example, is given by $1/\sqrt{\pi} T_2$. More generally, one may expect continuous dispersion curves to be obtained when $$\chi_0 \lesssim \left(\frac{\Delta w_0}{w}\right)^2 \tag{9}$$

where $\Delta w_0$ is the resonant line width.

One may fulfill equations (8) or (9) by simply diluting the sample or intentionally broadening the resonance line as, for example, by making $H_0$ slightly non-uniform over the volume of the sample.

As an example of the operating parameters using the $^{19}$F nuclei in polytetrafluoroethelene as the sample material, a resonant cavity having a volume of 101.4 cm$^3$ may be employed with a filling factor of 0.955. A tunnel diode oscillator at a frequency of $w_0/2\pi = 54.97$ MHz excites the cavity resonator with a field $H_1 = 7 \times 10^{-8}$ tesla. For an external field $H_0 = 1.372$ tesla, the frequency pulling of the oscillator at room temperature produces a maximum-to-minimum frequency difference of 330 Hz with a line width of $8 \times 10^{-4}$ tesla. The natural line width of $4 \times 10^{-4}$ tesla ($T_2 = 2.3 \times 10^{-5}$ seconds) may be broadened to $8 \times 10^{-4}$ tesla by inhomogeneities in the external magnetic field. For this particular sample, $T_1 = 1$ second and $\gamma = w_0/H_0$ equals $2.5167 \times 10^8$ radians/sec-tesla. The $H_1$ field at which saturation occurs is equal $1/\gamma\sqrt{T_1 T_2} = 8.3 \times 10^{-7}$ tesla. The saturation factor is $1 + \gamma^2 H_1^2 T_1 T_2 = 1.007$. The static susceptibility, $\chi_0$, for this sample is therefore equal to $1.77 \times 10^{-9}$ which is smaller than the threshold static susceptibility above, given by $1/\pi w_0^2 T_2^2 = 5.04 \times 10^{-9}$, in which discontinuities or frequency jumps are produced.

EXPERIMENTAL APPARATUS

FIG. 1 is a block schematic diagram of the electronics utilized in the magnetic resonance detection apparatus in accordance with the invention. The electronic circuitry comprises a reentrant cavity resonator 2 represented by the parallel LC arrangement utilizing capacitor C1 and inductor L1. Resonator 2 forms part of a free-running oscillator more particularly shown as a tunnel diode oscillator 4 and comprising diode D1, resistors R1 and R2 and capacitor C2 as shown. The tunnel diode D1 of the oscillator 4 may be coupled to the inductor portion of the cavity resonator 2 as represented by dotted line A1 and more particularly shown in FIG. 2, or may alternatively be coupled to the capacitive portion of the cavity resonator 2 as represented by dotted line A2 and more particularly shown in FIG. 3. One end of capacitor C2 and resistor R2 is grounded and connected to a sheath 8 of the oscillator driving cable 9. The junction of resistor R1 and capacitor C2 is connected to center conductor 6 of the driving cable 9 which also supplies an output signal to processing electronics 10. The tunnel diode oscillator 4 is driven by a power circuit 14 for supplying a DC current along conductor 6. Power circuit 14 comprises a battery B and resistors R3 and R4 together with a capacitor C3 as shown. The DC bias current supplied along conductor 6 may be varied as for example by utilizing a variable resistor R3, or a variable power source, or other means to adjust the bias current. Varying the bias current slightly varies the oscillator frequency by changing the capacitance of the diode D1. The output signal from conductor 6 is fed to the processing electronics which comprises a coupling capacitor C4, amplifier 18, frequency counter 20, digital printer 25 and optionally a digital/analog conversion means and chart recorder 24.

FIG. 2 is a cross-sectional diagram of a reentrant cavity resonator 30 corresponding to the electrically schematic resonator 2 of FIG. 1. The cavity resonator 30 comprises a cylindrical section 34 and an end plate 36, both made of a good electrically conducting material such as copper. The end plate 36 is secured to the cylindrical section 34 by means of screws which may also be made of copper in order to eliminate stress problems due to differences in thermal contraction as the temperature is varied. The cavity resonator 30 further comprises a central portion 38 spaced slightly from the end portion 36 to define the capacitor gap $d$ corresponding to capacitor C1 in FIG. 1. The capacitor gap $d$ is typically on the order of 0.003 cm or less and has been greatly exaggerated in the illustration for purposes of clarity. Gap $d$ may have a dielectric material therewithin to enhance its capacity and reduce the effect of mechanical vibrations. The central portion 38 may be a solid copper cylinder concentrically oriented with respect to the cylindrical section 34. Cylindrical section 34 has a shoulder 40 on which a support member 44 is seated. Support member 44 is secured to the central portion 38, and may be as shown an integral part thereof. Support member 44 is likewise composed of a good electrical conductor such as copper. End plate 36, cylindrical section 34, central portion 38 and support member 44 define a cavity region 46 in which the material sample is placed.

The inductor L1 of FIG. 2 is in effect a single-turn coil about cavity region 46 formed by the end plate 36, cylindrical section 34, support member 44 and central portion 38 along the path represented by the dotted line P of FIG. 2. The tunnel diode D1 is electrically coupled to the cavity region 46 of cavity resonator 30 by means of a coupling loop 48. The path defined by dotted line P within the resonator 30 is representative of the rf current single loop path. The rf current establishes a linearly polarized rf magnetic field $H_1$ perpendicular to the external field $H_0$ which is shown in the direction of the symmetry axis of the resonator 30. This rf magnetic field causes energy level changes (spin flips) at the resonance frequency of the sample nuclei. The simple geometry of the reentrant cavity resonator 30 having an effective single turn allows an accurate determination of the filling factor $\beta$ in contrast to standard multi-turn coils where $\beta$ is difficult to accurately determine.

FIG. 3 shows an alternative arrangement for a reentrant cavity resonator 50 wherein the diode D1 is coupled to the capacitor C1 of the resonator. Cavity resonator 50 comprises a closed cylindrical member 52 having an end portion 54 secured thereto by means of screws. Member 52 and end portion 54 as well as the securing screws are all made of the same conducting material such as copper. A central member 56 projects into closed cylindrical member 52 and defines a gap of dimension $d$ forming the capacitor C1 of the cavity resonator 50. The tunnel diode D1 is located within the central member 56 and the driving/output conductor 6 is taken through the end portion 54 to the processing electronics 10 of FIG. 1.

In both the embodiments of FIGS. 2 and 3, the frequency of the output signal from conductor 6 is counted by means of counter 20, recorded on a digital printer 25 and, if desired, converted to analog form to provide a display or recording as shown in FIG. 4. In practice, the cavity region 46 of FIG. 2 or 58 of FIG. 3 is filled with the sample nuclei. The sample typically completely fills the cavity region. Because of the particular geometry utilized, the rf magnetic field lines are circular and perpendicular to the central member 38 of FIG. 2 or member 56 of FIG. 3. The external magnetic field $H_0$ is applied (by magnetic field generating means, not shown) parallel to the central member of the reentrant cavity resonator so that the rf magnetic field $H_1$ is maintained perpendicular to the external field $H_0$. The external magnetic field $H_0$ causes a precession of the nuclear spins about $H_0$, and the rf field induces energy changes as the external field passes through the nuclear resonance. The curve shown in FIG. 4 is represenative of the variation of the oscillator frequency as the magnetic field passes through a resonance of the sample nuclei. As the magnetic field is varied the precession frequency of the nuclei passes through the oscillator frequency and the oscillator frequency is effectively pulled to one side and then to the other side of its normal frequency. The resultant plot as shown in FIG. 4 is essentially a dispersion curve and may be utilized in equations (2)–(6) to provide the static magnetic susceptiblity as outlined hereinabove.

By measuring the frequency of the oscillator, as opposed to an amplitude signal, one eliminates the calibration problems associated with the resonator quality factor, rf amplifier gain and detector electronics. The oscillator frequency, for example, is extremely stable (2 × $10^{-9}$ parts for a 1 second averaging time at room temperature) and is quite independent of magnetic field. Consequently, a much more accurate determination of nuclear magnetic susceptiblity and other parameters may be made.

Representative values of the various circuit elements shown in FIG. 1 are set forth in the following table by way of example and not by way of limitation.

TABLE

| Element | Value/Manufacturer |
|---------|-------------------|
| D1 | Back Diode BD-402 General Electric Co. |
| L1 | 8 nH |
| C1 | 1000 pF (optional dielectric of, for example, $Al_2O_3$) |
| C2 | 1000 pF ATC 100–102MC American Technical Ceramics Huntington, N.Y. |
| C3 | 10,000 pF |
| R1 | 1k $\Omega$ |
| R2 | 100 $\Omega$ TRM 2-12 EMC Technology Cherry Hill, N.J. |
| R3 | 1k $\Omega$ |
| R4 | 500 $\Omega$ |
| B | 2.7 volts, mercury battery |
| 20 | Frequency Counter HP 5345A Hewlett-Packard |

One may observe the sample resonance by applying a constant external magnetic field $H_0$ and varying the oscillator frequency about the nuclear precession frequency to achieve the resonant energy transitions. In such a case a variable bias voltage is applied to the tunnel diode, and the resultant output frequency signal along conductor 6 is plotted as a function of the bias voltage.

It is evident that the principles of the frequency measurement technique as discussed herein may also be utilized for electron spin resonance experiments, nuclear quadrupole resonance, microwave spectroscopy and in the determination of electron spin susceptibilities. The utilization of the extremely stable tunnel diode oscillator which incorporates a reentrant cavity resonator is particularly suitable to the measurements of nuclear magnetic moments and nuclear magnetic susceptibility as discussed herein but may also be applicable to ESR and NQR measurements as well as other resonant spectroscopy measurements.

We claim:

1. Magnetic resonance apparatus for determining a magnetic property of a sample wherein the sample is placed in a varying magnetic field and energy transitions are induced in said sample by a rf field during a resonance in said sample comprising:
   (a) a free-running oscillator including an LC resonant cavity, said rf field established within said cavity,
   (b) power supply means connected to said oscillator for biasing said oscillator,
   (c) means for placing said sample in a cavity region of said resonant cavity, and
   (d) means for measuring the frequency of said oscillator as a function of said varying magnetic field during a resonance of said sample for determining from said frequency measurement the magnetic property of said sample.

2. Apparatus as recited in claim 1 wherein said free-running oscillator comprises a tunnel diode as a negative resistance element therein.

3. Apparatus as recited in claim 2 wherein said tunnel diode is coupled to an inductive region of said resonant cavity.

4. Apparatus as recited in claim 2 wherein said tunnel diode is coupled to a capacitive region of said resonant cavity.

5. Apparatus as recited in claim 1 wherein said resonant cavity comprises a reentrant resonant cavity.

6. Apparatus as recited in claim 5 wherein said free-running oscillator comprises a tunnel diode as a negative resistance element therein.

7. Apparatus as recited in claim 6 wherein said tunnel diode is coupled to an inductive region of said reentrant resonant cavity.

8. Apparatus as recited in claim 6 wherein said tunnel diode is coupled to a capacitive region of said reentrant resonant cavity.

9. Apparatus as recited in claim 5 wherein said reentrant resonant cavity comprises an electrically conductive enclosure, said enclosure defining said cavity therein and a conductive member having one end thereof connected to said enclosure and being generally directed inwardly of said enclosure, the other end of said member spaced from said enclosure to define a capacitive gap between said member and the enclosure.

10. Apparatus as recited in claim 9 wherein the enclosure and conductive member have a circular cross section and said conductive member is concentrically disposed within said enclosure.

11. Apparatus as recited in claim 10 wherein said oscillator comprises a tunnel diode as a negative resistance element therein.

12. Apparatus as recited in claim 11 wherein said tunnel diode is positioned within said conductive member closely adjacent to said other end of said conductive member.

13. Apparatus as recited in claim 12 wherein said resonance in said sample is a nuclear magnetic resonance.

14. Apparatus as recited in claim 1 wherein said resonance in said sample is a nuclear magnetic resonance.

15. Apparatus as recited in claim 1 wherein said resonance in said sample is a nuclear quadrupole resonance.

16. Apparatus as recited in claim 1 wherein said resonance in said sample is an electron spin resonance.

17. In a magnetic resonance measurement apparatus wherein a sample material is placed in a first relatively slow varying magnetic field and energy transitions are induced therein by the application of a second, relatively fast varying electromagnetic field having a magnetic component perpendicular to said first magnetic field, and wherein an oscillator generates said electromagnetic field in the vicinity of said sample material the improvement comprising:
means for measuring the frequency of said oscillator as a function of said first magnetic field during a magnetic resonance of said sample, said frequency being a continuous function of said first magnetic field.

18. A method of measuring the nuclear susceptibility of a set of nuclei in a material comprising the steps of:
(a) placing a sample of said material in a cavity region of a LC reentrant cavity resonator forming a positive resistive element of an oscillator,
(b) positioning said resonator in a varying magnetic field so as to induce nuclear energy transitions during a magnetic resonance of said nuclei,
(c) measuring the frequency of said oscillator as a function of varying magnetic field, and
(d) determining the nuclear susceptibility from said frequency measurements.

19. A method as recited in claim 18 wherein the step of determining the nuclear susceptibility comprises the steps of determining the real part of the nuclear magnetic susceptibility by the steps of:
(a) calculating the inductance L of the oscillator from the expression $$f = \frac{1}{2\pi \sqrt{LC}}, \text{ and}$$

(b) calculating the real part $\chi'$ of the complex magnetic susceptibility $\chi = \chi' - i\chi''$ from the expression $$L = L_0(1 + 4\pi\beta\chi')$$

where $\beta$ is a constant and $L_0$ is the inductance of the empty resonator.

20. A method as recited in claim 19 wherein the complex part of the nuclear magnetic susceptibility is determined by the step of:
calculating the complex part $\chi''$ of the complex magnetic susceptibility $\chi$ from the Krönig-Kramers relationship $$\chi''(w) = \frac{-1}{\pi} \rho \int_{\infty}^{\infty} \frac{\chi'(w')}{w' - w} dw'$$

where $\rho$ is the principal value of the integral, and $w$ is the oscillator frequency.

21. A method as recited in claim 20 wherein the static nuclear magnetic susceptibility, $\chi_0$, is determined by the step of:
calculating the static magnetic susceptibility $\chi_0$ of the sample nuclei from the relation $$\chi_0 = \frac{1}{\pi} \rho \int_{\infty}^{\infty} \frac{\chi''(w')dw'}{w'}.$$

22. A method as recited in claim 21 further comprising the step of calculating one of the parameters of the group N, $\mu$, $T_s$, I from the relation $$\chi_0 = \frac{N\mu^2(I + 1)}{3kT_sI}$$

where N is the volume number density of nuclei, $\mu$ is the nuclear magnetic moment, $T_s$ is the spin temperature, I is the nuclear spin and $k$ is Boltzmann's constant.

* * * * *